(12) United States Patent
Yamauchi

(10) Patent No.: US 7,218,544 B2
(45) Date of Patent: May 15, 2007

(54) MASK ROM

(75) Inventor: Hiroyuki Yamauchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 127 days.

(21) Appl. No.: 11/121,135

(22) Filed: May 4, 2005

(65) Prior Publication Data

US 2005/0254280 A1    Nov. 17, 2005

(30) Foreign Application Priority Data

May 12, 2004    (JP)   ............................ 2004-142515

(51) Int. Cl.
*G11C 17/00* (2006.01)
*G11C 5/06* (2006.01)

(52) U.S. Cl. ........................................ 365/104; 365/63
(58) Field of Classification Search ................ 365/104, 365/63, 72
See application file for complete search history.

(56) References Cited

U.S. PATENT DOCUMENTS

| | | | |
|---|---|---|---|
| 5,392,233 A | 2/1995 | Iwase | |
| 5,875,128 A * | 2/1999 | Ishizuka | ................ 365/185.06 |
| 6,243,284 B1 | 6/2001 | Kumagai | |
| 6,269,017 B1 | 7/2001 | Lu et al. | |
| 6,388,911 B1 | 5/2002 | Lee | |
| 6,809,948 B2 | 10/2004 | Nachumovsky et al. | |
| 6,826,073 B2 | 11/2004 | Liaw et al. | |
| 6,906,951 B2 * | 6/2005 | Wong | ..................... 365/185.03 |
| 6,920,058 B2 * | 7/2005 | Morikawa | ..................... 365/94 |
| 7,102,926 B2 * | 9/2006 | Lee et al. | .............. 365/185.11 |
| 2003/0235096 A1 | 12/2003 | Chen et al. | |

FOREIGN PATENT DOCUMENTS

| | | |
|---|---|---|
| JP | 2863661 | 7/1993 |
| JP | 9-82090 | 3/1997 |
| JP | 9-153293 | 6/1997 |
| JP | 10-56085 | 2/1998 |
| JP | 3206591 | 10/2000 |

* cited by examiner

*Primary Examiner*—Richard T. Elms
*Assistant Examiner*—Allison P. Bernstein
(74) *Attorney, Agent, or Firm*—McDermott Will & Emery LLP

(57) ABSTRACT

A mask ROM includes bit lines, word lines intersecting with the bit lines and bit cells provided along the word lines, each of the bit lines being formed of a cell transistor having a gate connected to an associated one of the word lines. In the mask ROM, further provided is a source node commonly connected to respective sources of ones of the cell transistors having a gate connected to one of adjacent two word lines. A current flows from a selected bit line to a non-selected bit line via a cell transistor selected in reading out data and the source node.

3 Claims, 15 Drawing Sheets

FIG. 5

| Selected BL | CLM$_0$ | CLM$_1$ | CLM$_2$ | CLM$_3$ | CLM$_4$ | CLM$_5$ | CLM$_6$ | CLM$_7$ |
|---|---|---|---|---|---|---|---|---|
| BL$_0$ | OFF | ON | Don't care | Don't care | Don't care | Don't care | Don't care | Don't care |
| BL$_1$ | Don't care | OFF | ON | Don't care | Don't care | Don't care | Don't care | Don't care |
| BL$_2$ | Don't care | Don't care | OFF | ON | Don't care | Don't care | Don't care | Don't care |
| BL$_3$ | Don't care | Don't care | Don't care | OFF | ON | Don't care | Don't care | Don't care |
| BL$_4$ | Don't care | Don't care | Don't care | Don't care | OFF | ON | Don't care | Don't care |
| BL$_5$ | Don't care | Don't care | Don't care | Don't care | Don't care | OFF | ON | Don't care |
| BL$_6$ | Don't care | Don't care | Don't care | Don't care | Don't care | Don't care | OFF | ON |
| BL$_7$ | Don't care | Don't care | Don't care | Don't care | Don't care | Don't care | ON | OFF |

FIG. 6

| Selected BL | CLM₀ | CLM₁ | CLM₂ | CLM₃ | CLM₄ | CLM₅ | CLM₆ | CLM₇ |
|---|---|---|---|---|---|---|---|---|
| BL₀ | OFF | ON | ON | ON | ON | ON | ON | ON |
| BL₁ | ON | OFF | ON | ON | ON | ON | ON | ON |
| BL₂ | ON | ON | OFF | ON | ON | ON | ON | ON |
| BL₃ | ON | ON | ON | OFF | ON | ON | ON | ON |
| BL₄ | ON | ON | ON | ON | OFF | ON | ON | ON |
| BL₅ | ON | ON | ON | ON | ON | OFF | ON | ON |
| BL₆ | ON | ON | ON | ON | ON | ON | OFF | ON |
| BL₇ | ON | ON | ON | ON | ON | ON | ON | OFF |

FIG. 7

| Selected BL | $CLM_0$ | $CLM_1$ | $CLM_2$ | $CLM_3$ | $CLM_4$ | $CLM_5$ | $CLM_6$ | $CLM_7$ |
|---|---|---|---|---|---|---|---|---|
| $BL_0$ | OFF | ON | ON | Don't care | Don't care | Don't care | Don't care | Don't care |
| $BL_1$ | ON | OFF | ON | Don't care | Don't care | Don't care | Don't care | Don't care |
| $BL_2$ | Don't care | ON | OFF | ON | Don't care | Don't care | Don't care | Don't care |
| $BL_3$ | Don't care | Don't care | ON | OFF | ON | Don't care | Don't care | Don't care |
| $BL_4$ | Don't care | Don't care | Don't care | ON | OFF | ON | Don't care | Don't care |
| $BL_5$ | Don't care | Don't care | Don't care | Don't care | ON | OFF | ON | Don't care |
| $BL_6$ | Don't care | Don't care | Don't care | Don't care | Don't care | ON | OFF | ON |
| $BL_7$ | Don't care | Don't care | Don't care | Don't care | Don't care | ON | ON | OFF |

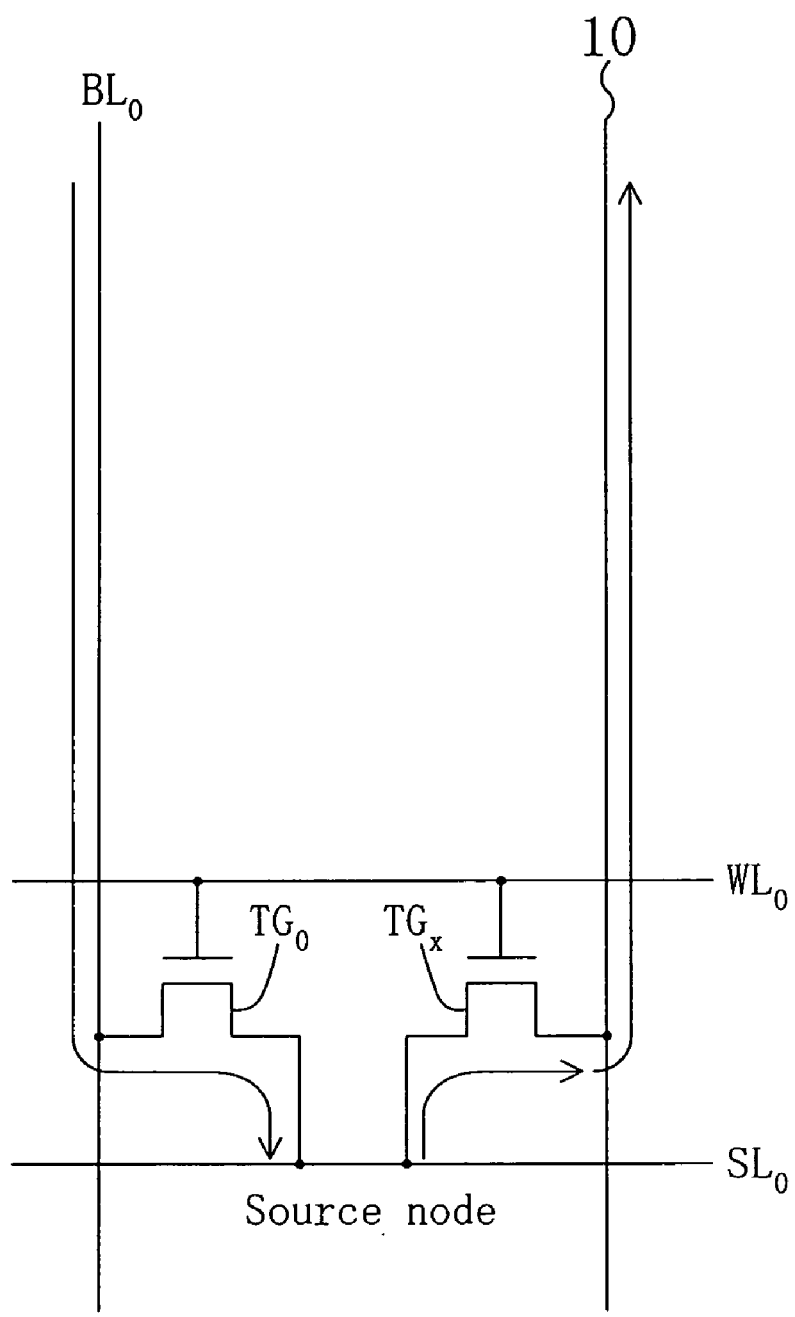

MASK ROM

CROSS-REFERENCE TO RELATED APPLICATION

This application claims priority under 35 U.S.C. §119(a) on Japanese Patent Application No. 2004-142515 filed on May 12, 2004, the entire contents of which are hereby incorporated by reference.

BACKGROUND OF THE INVENTION

Field of the Invention

The present invention relates to a mask ROM programmed by connection/disconnection between a bit line and a drain.

As a read-only memory which requires a short time (i.e., turn around time which will be referred to as a "TAT") from a time when information to be written is received from a user to a time when a product is supplied, a mask ROM has been widely used.

In a general mask ROM, bit lines $BL_0$, $BL_1$, . . . , word lines intersecting the bit lines and a plurality of bit cells each of which is formed of a single cell transistor are provided. Information is read according to whether or not bit line connection is present or not in each of the bit cells (see a left drawing in FIG. 1). Moreover, in Japanese Laid-Open Publication No. 9-153293, a mask ROM in which source lines are provided so that each source lines is located between two adjacent cell transistors and connected to a source of each of the two cell transistors and extend in parallel to bit lines is disclosed. In the mask ROM, a potential of a virtual GND line serving as a source line is changed from a ground level to a power supply voltage level. Specifically, by setting a potential of a virtual GND (selected virtual GND line) connected to a bit cell from which information is desired to be read at a ground level, and a potential of a virtual GND line (non-selected virtual GND line) at a power supply voltage level, information recorded in a desired bit cell can be read out.

SUMMARY OF THE INVENTION

However, a virtual GND scheme realized in the known mask ROM has the following problems.

A first problem is that a large parasitic capacitance is generated in a virtual GND line. This is because a plurality of bit cells are connected to a single virtual GND line and each of the plurality of bit cells is connected to two bit lines located adjacent to each other. Normally, the number of bit cells (memory cells) connected to a bit line is 1024 or more and a parasitic capacitance generated in a virtual GND line reaches the same level as that of the bit line.

The virtual GND line has to serve as a ground line when the virtual GND line is read, and serve as a control line for separating non-selected bit cells from a selected bit cell when the virtual GND line is not selected. Therefore, for example, to read a single memory cell, each of the potential of a single selected bit line and the potential of a single non-selected source line has to be changed from the ground line level to the power supply voltage level. Thus, as a large parasitic capacitance is generated in a virtual GND line (i.e., source line), power consumption is increased. Moreover, compared to the case where a parasitic capacitance is small, a longer driving time is required. This results in increase in access time in the mask ROM.

A second problem is that because of the necessity to provide interconnects such that two interconnects, i.e., a bit line and a source line as a pair extend in the same direction, each of the bit line and the source line is shared by adjacent two bit cells in the direction in which word lines extend. Accordingly, in the known mask ROM, a single contact is shared by adjacent bit cells and, therefore, it is difficult to write information into a single transistor for each a bit line contact or a source line contact. Therefore, conventionally, a ROM using the above-described virtual GND line can not be programmed using a contact mask or a metal mask, and can be programmed only by directly changing a threshold of a transistor using a threshold injection mask.

It is therefore an object of the present invention to provide a mask ROM capable of high-speed operation, compared to the known mask ROM, and requiring only a short TAT.

A mask ROM according to the present invention is characterized in that the mask ROM includes: a plurality of bit lines; a plurality of word lines disposed so as to intersect with the plurality of bit lines, and a plurality of bit cells provided along the plurality of bit lines or the plurality of word lines, each of the bit cells being formed of a first conductivity type cell transistor having a gate electrode connected to one of the plurality of word lines, data is recorded by connection/disconnection between a drain of the cell transistor and one of the plurality of bit lines, if among the plurality of word lines, word lines located adjacent to each other are a first word line and a second word line, respectively, the mask ROM further includes a source node commonly connected to respective sources of cell transistors each having a gate electrode connected to the first word line or the second word line, and, if among the cell transistors in the bit cells, a transistor connected to a bit line selected from the plurality of bit lines and the source node is selected in reading out data, a current flows from the selected bit line to the source node via the selected cell transistor.

With the above-described configuration, the number of cell transistors connected to a single bit line can be reduced, compared to the known mask ROM using a virtual GND line, so that a parasitic capacitance can be reduced. Moreover, data can be read out only by changing the potential of the source node from a low level to a high level or from a high level to a low level. Therefore, compared to the known mask ROM, increase in operation speed and reduction in power consumption can be achieved. Furthermore, compared to a mask ROM to which information is written by a writing method using ion implantation, a mask ROM requiring a shorter TAT can be achieved.

In one embodiment of the present invention, the mask ROM further includes: a first power supply line, and in reading out data, the selected bit line is connected to a bit line connected to a non-selected cell transistor via the selected cell transistor and the source node, or the first power supply line. Thus, a current flowing from the selected cell transistor flows in non-selected bit lines and the first power supply line and recorded data can be read out by sensing a change in current flowing in these lines.

It is preferable that in reading out data, the selected bit line is connected to the first power supply line of which a potential is lower than a potential of the selected bit line. Thus, when each cell transistor is formed of an n-channel MOSFET, a current can be made to flow smoothly from the selected bit line to the first power supply line via the selected cell transistor. Specifically, with the first power supply line provided, even when a read-out current does not flow in a non-selected bit line, recorded data can be read out and a restriction on programming into the mask ROM can be eliminated. Note that in this case, it is more preferable that the potential of the first power supply line is the ground potential.

The mask ROM may further include: a first conductivity type dummy cell transistor provided between the source node and the first power supply line and having a gate connected to the first word line or the second word line connected to the gate of the selected cell transistor and a drain connected to the source node.

In one embodiment of the present invention, in reading out data, the selected bit line is connected to a bit line connected to a non-selected cell transistor having a gate connected to the gate of the selected cell transistor via the first word line or the second word line, and in reading out data, a potential of the bit line connected to the non-selected cell transistor is lower than that of the selected bit line. Thus, when each cell transistor is formed of an n-channel MOSFET, a current can be made to flow smoothly from the selected bit line to a bit line connected to a non-selected cell transistor. By sensing the current, then, data can be read out.

In one embodiment of the present invention, the mask ROM further includes: a sense amplifier connected to the plurality of bit lines, and in reading out data, the sense amplifier senses a difference in a current flowing in the bit line connected to the non-selected cell transistor of which gate is connected to the gate of the selected cell transistor via the first word line or the second word line before and after a potential change. Thus, even if the number of cell transistors which are not connected to a bit line differs among different parts of a memory array, data can be read out in a simple manner.

In one embodiment of the present invention, the mask ROM further includes: a second power supply line; and first field effect transistors each being provided between the second power supply line and an associated one of the plurality of bit lines, and in reading out data, of the first field effect transistors, a first field effect transistor connected to the selected bit line becomes an OFF state and the other field effect transistors become an ON state. Thus, the second power supply line can be connected to a non-selected bit line. Therefore, for example, if each cell transistor is formed of an n-channel MOSFET, the mask ROM can be so configured that with the second power supply line as a ground line, a current from a selected bit line flows to a non-selected bit line.

In one embodiment of the present invention, the mask ROM further includes: a source pre-charging circuit for pre-charging, if the selected cell transistor is not connected to the source node in reading out data, a source of the cell transistor connected to the source node. Thus, a leakage current from a non-selected cell transistor can be reduced, so that reduction in power consumption and improvement of accuracy in data reading can be achieved.

The source pre-charging circuit may include a third power supply line for supplying a higher voltage than voltages of the first power supply line and the second power supply line, a second conductivity type second field effect transistor having a source connected to the third power supply line and a gate connected to the first word line, and a second conductivity type third field effect transistor having a source connected to the drain of the second field effect transistor, a drain connected to the source node and a gate connected to the second word line.

In one embodiment of the present invention, the mask ROM further includes: a control line of which a potential becomes an equal level to a potential level of the selected first or second word line when one of the first word line and the second word line is selected and becomes a different level from those of the first word line and the second word line when neither the first word line nor the second word line is selected, and in reading out data, the control line is connected to the source node. Thus, the potential of a source node can be controlled, so that a mask ROM which is operable at higher speed than the known mask ROM while using lower power consumption than that of the known mask ROM can be achieved.

The mask ROM may further include: a first conductivity type fourth field effect transistor having a drain and a gate each being connected to the control line and a source connected to the source node; a first conductivity type fifth field effect transistor provided between the control line and the source node and having a gate connected to the first word line; and a first conductivity type sixth field effect transistor provided between the control line and the source node and having a gate connected to the second word line.

In the mask ROM of the present invention, a line corresponding to a virtual GND is a non-selected bit line or a single ground line provided for exclusive use as a virtual GND. Thus, unlike the known mask ROM, even without providing bit lines so that a bit line is not shared by adjacent cells, a bit line can be independently provided for each bit cell. Therefore, a control line for separating cells used in the known mask ROM is not needed. Accordingly, it is not necessary to drive a non-selected bit line or a single ground line provided for exclusive use as a virtual GND between the power supply voltage potential and the ground line potential for the purpose of separation. Thus, power consumption can be reduced, compared to the known mask ROM, and the occurrence of an access delay can be suppressed.

Furthermore, in a source node section according to the present invention, a source portion is shared only between first and second transfer gate transistors connected to the same first word line or between third and fourth transfer gate transistors connected to the second word line located adjacent to the first word line. With the source portion so configured to be independent from another source portion for each one of plurality of bit lines connected to the first, second, third and fourth transfer gate transistors, respectively, a floating capacitance of the source node section of which a potential is needed to be changed can be reduced, thus resulting in reduction in power consumption and driving time.

BRIEF DESCRIPTION OF THE DRAWINGS

FIG. 5 is a diagram showing an example of control performed by column control signals in reading out data in the mask ROM of the embodiment of the present invention.

FIG. 6 is a diagram showing an example of control performed by column control signals in reading out data in a mask ROM according to the embodiment of the present invention.

FIG. 7 is a diagram showing an example of control performed by column control signals in reading out data in the mask ROM of the embodiment of the present invention.

FIG. 8 is a conceptual diagram illustrating the operation of the mask ROM of the embodiment of the present invention.

DESCRIPTION OF THE PREFERRED EMBODIMENTS

Circuit Configuration of Mask ROM

Figure 1:
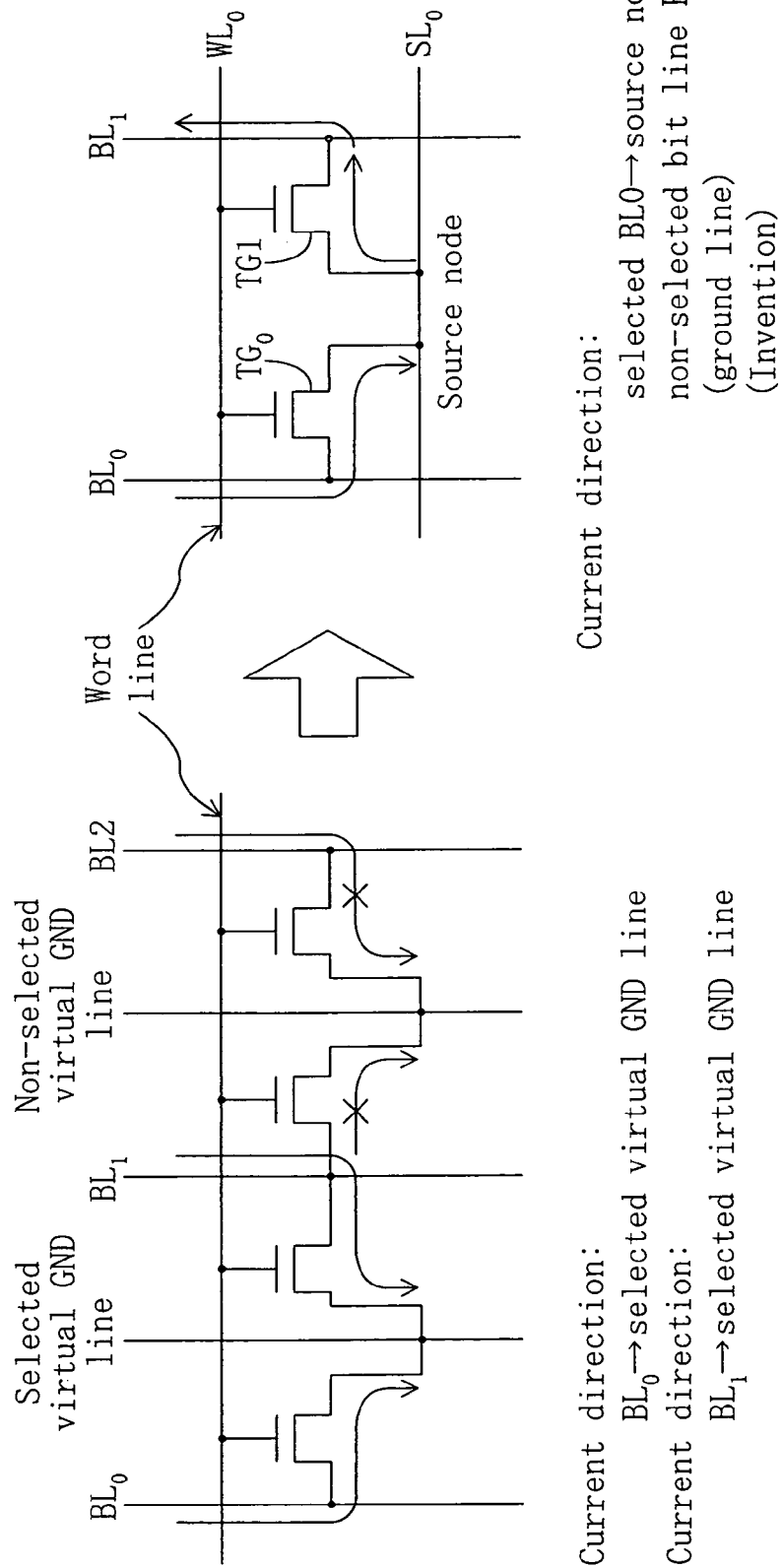
FIG. 1 is a circuit diagram showing comparison between a bit cell of a known mask ROM and a bit cell of a mask ROM according to the embodiment of the present invention.
Figure 2:
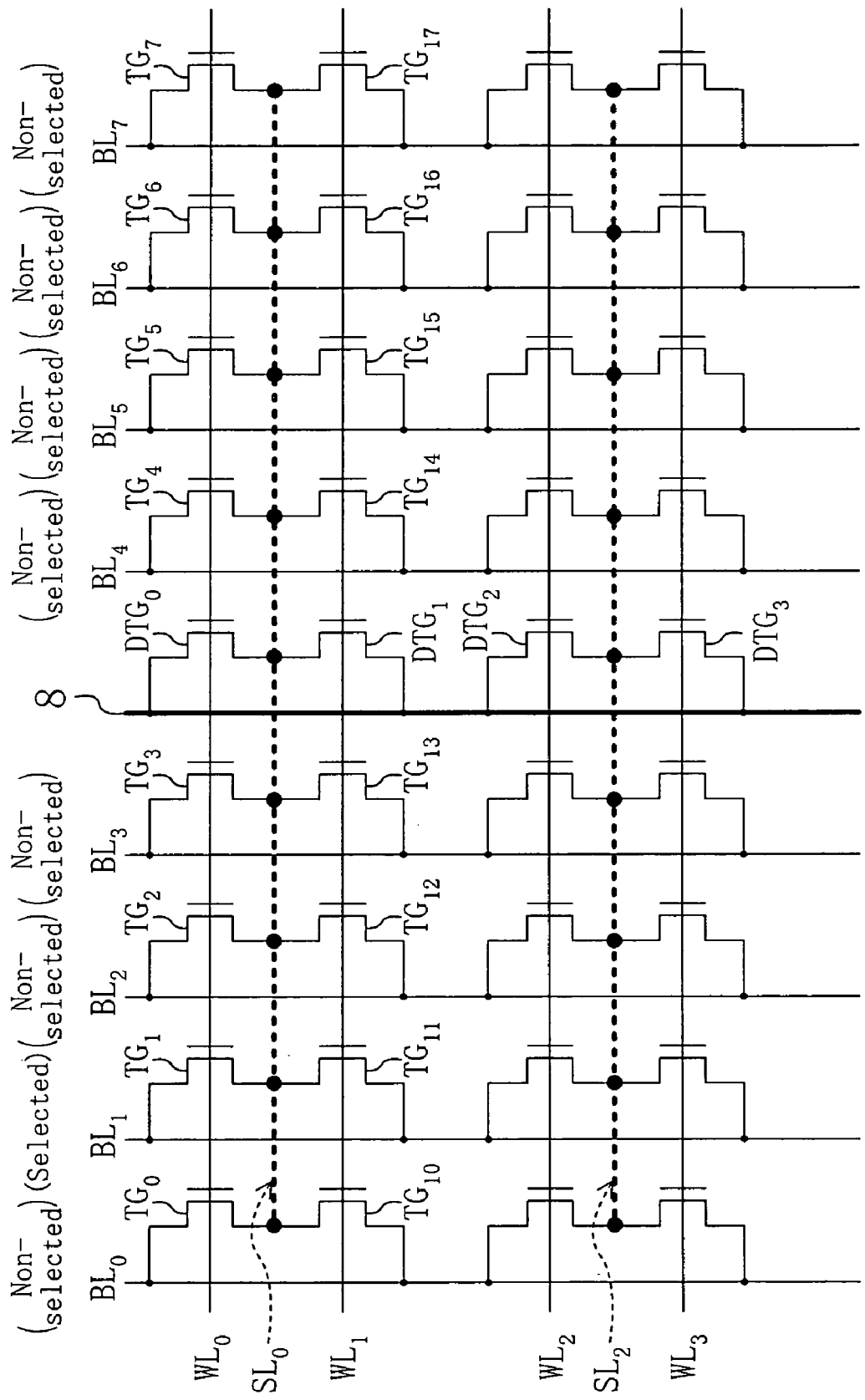
FIG. 2 is a circuit diagram illustrating a memory array of a mask ROM of the embodiment of the present invention.

FIG. 1 is a circuit diagram showing comparison between a bit cell of a known mask ROM and a bit cell of a mask ROM according to an embodiment of the present invention. FIG. 2 is a circuit diagram illustrating an example of a mask ROM according to an embodiment of the present invention.

As shown in FIG. 2, the mask ROM of this embodiment includes bit lines $BL_0$, $BL_1$, . . . , word lines $WL_0$, $WL_1$, . . . intersecting the bit lines $BL_0$, $BL_1$, . . . and a plurality of bit cells arranged in a matrix along the bit lines and the word lines. Each of the bit cells is formed of, for example, a single n-channel cell transistor of which the gate is connected to one of the word lines $WL_0$, $WL_1$, . . . . Moreover, the mask ROM of this embodiment further includes a source node (source line) SL connected to a source of each of a plurality of cell transistors each having a gate connected to a common word line, a first ground line 8 for supplying a ground potential to the source node, and dummy cell transistors $DTG_0$ . . . each of which is provided between a source node and a first ground line 8 and has a gate connected to a word line. In the example of FIG. 2, for example, respective sources of 16 cell transistors (cell transistors $TG_0$ through $TG_7$ and $TG_{10}$ through $TG_{17}$) are connected to a single source node $SL_0$. Moreover, in the mask ROM of this embodiment, data is irreversibly written according to whether or not a cell transistor is connected to a bit line through a contact or a metal.

Figure 3:
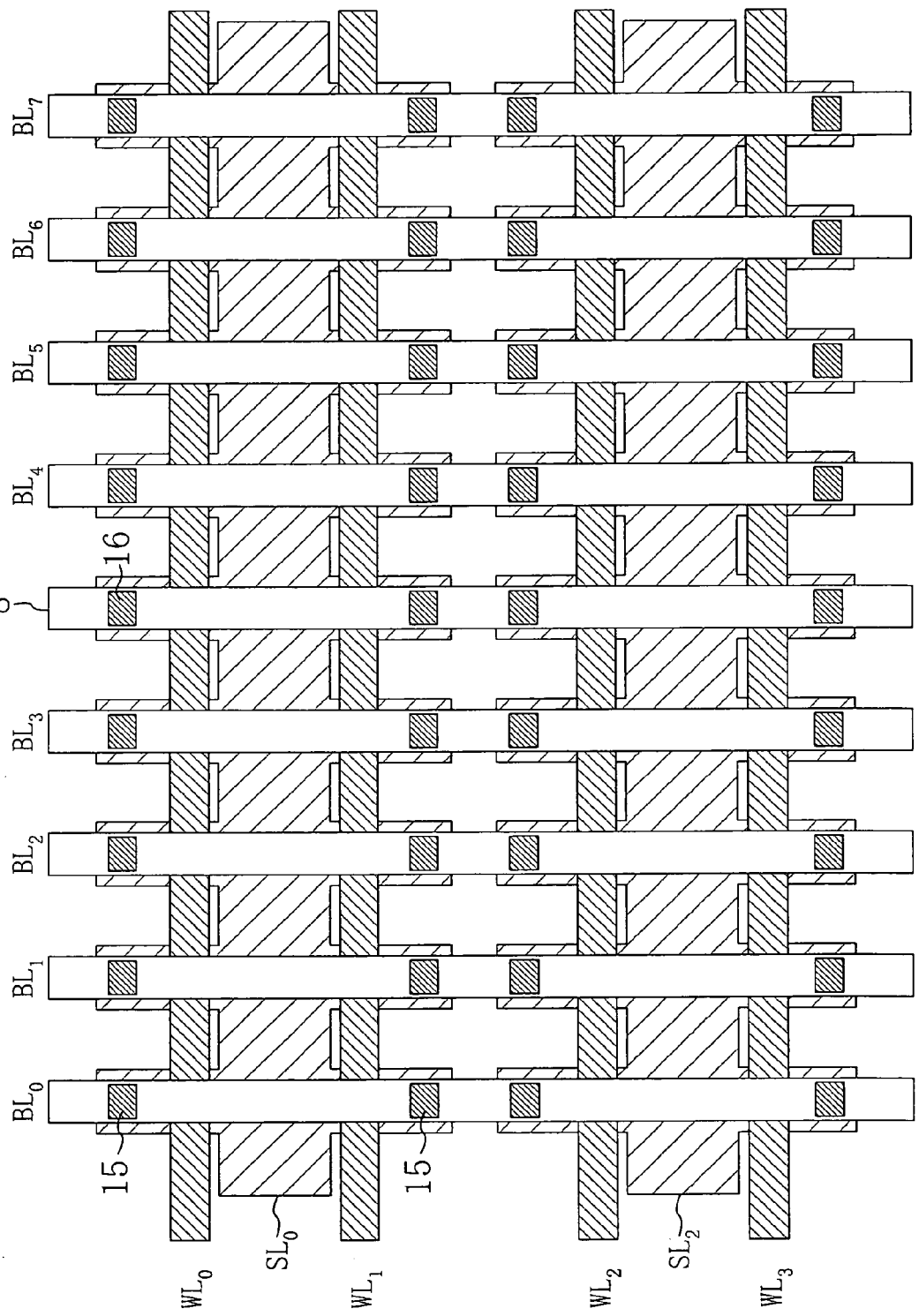
FIG. 3 is a plan view illustrating a layout of a memory array of the mask ROM of the embodiment of the present invention.

FIG. 3 is a plan view of the mask ROM of this embodiment when the mask ROM is viewed from the top. In the example of FIG. 3, respective drains of 32 cell transistors are connected to a bit line located over the drains with a contact 15 interposed therebetween. Note that there might be cases where some of the drains of the cell transistors are not connected to a bit line depending on data stored therein. In contrast, a contact 16 for connecting a first ground line 8 and an associated one of the dummy cell transistors has to be provided without exception.

Moreover, as shown in FIG. 3, although in the mask ROM of this embodiment, two cell transistors located adjacent to each other in the direction in which the bit lines extend are paired and connected to a common source node. Source nodes (for example, $SL_0$ and $SL_2$) are electrically independent from each other.

Next, a peripheral circuit for controlling a bit line selected when data is read out to a ground potential will be described.

Figure 4:
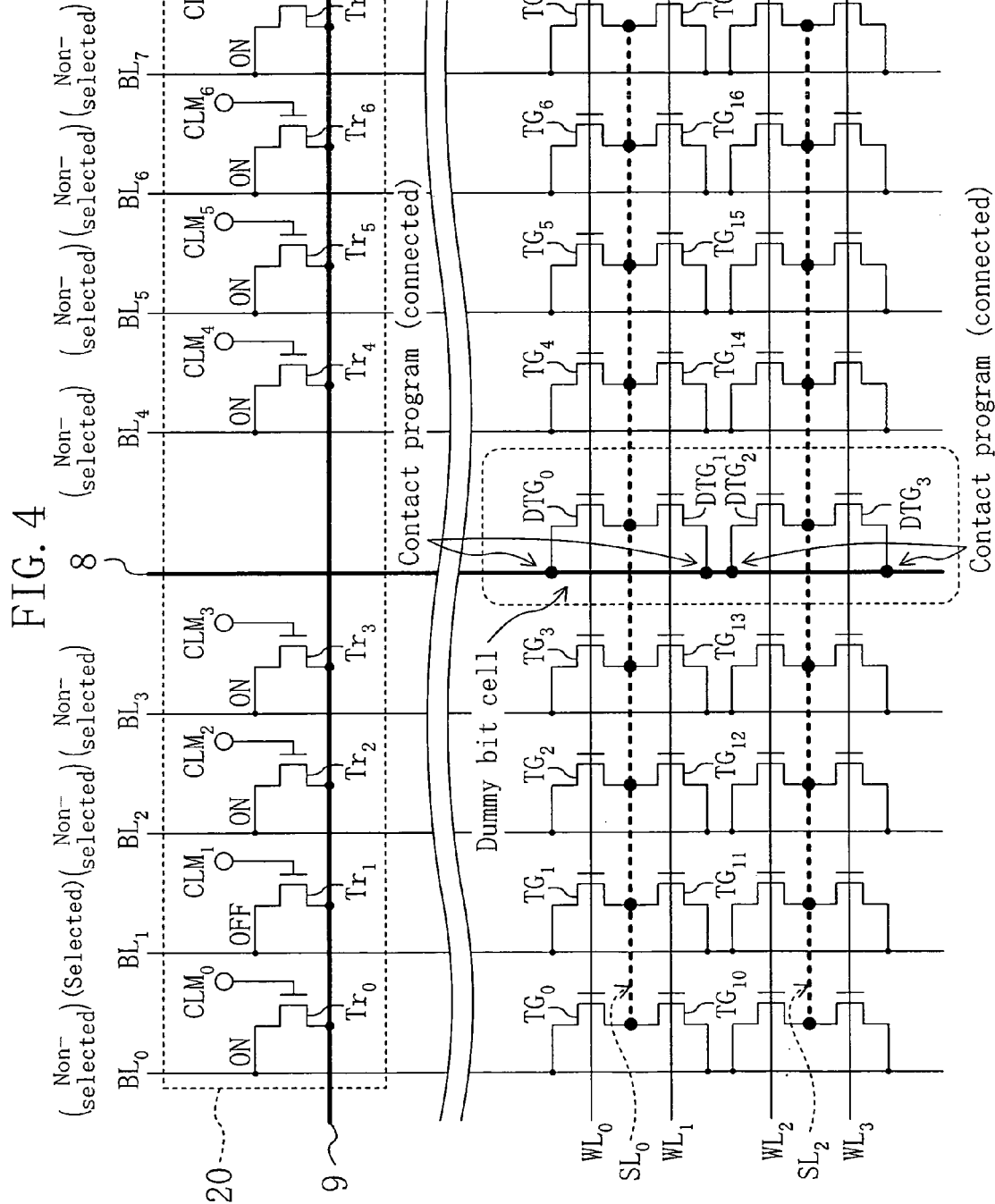
FIG. 4 is a circuit diagram of a source control circuit for adjusting a potential of a bit line and a memory array of the mask ROM of the embodiment of the present invention.

FIG. 4 is a circuit diagram of a source line control circuit 20 for adjusting a potential of a bit line and a memory array in the mask ROM of this embodiment.

As shown in FIG. 4, in the mask ROM of this embodiment, provided is a source line control circuit 20 for controlling, in reading out data, a potential of one of the source nodes $SL_0$, $SL_2$, . . . to which a selected transistor is connected via a non-selected bit line and a non-selected cell transistor connected to the non-selected bit line.

The source line control circuit 20 includes n-channel control transistors (first filed-effect transistors) $Tr_0$ through $Tr_7$. Respective first terminals (drains) of the control transistors $Tr_0$ through $Tr_7$ are connected to the bit lines $BL_0$ through $BL_7$ and respective second terminals (sources) of the control transistors $Tr_0$ through $Tr_7$ are connected to a second ground line 9 to share the second ground line 9. Then, the control transistors $Tr_0$ through $Tr_7$ are controlled to be conductive or not conductive by column control signals $CLM_0$ through $CLM_7$, respectively. If the control transistors $Tr_0$ through $Tr_7$ are brought into conduction by the column control signals $CLM_0$ through $CLM_7$, respectively, respective bit lines connected to the control transistors $Tr_0$ through $Tr_7$ are electrically connected to the second ground line 9 and become non-conductive. More detailed description on this will be given later.

Features and Operation of Mask ROM of this Embodiment

Next, features of the mask ROM of this embodiment will be described with reference to FIG. 1. In FIG. 1, bit cells when a data reading operation is performed are illustrated. In this case, the case where a bit line $BL_0$ is selected, a bit line $BL_1$ is not selected, and then data of a cell transistor $TG_0$ is read out is shown. Moreover, cell transistors $TG_0$ and $TG_1$ are connected to the bit lines $BL_0$ and $BL_1$, respectively, through a contact or a metal.

In the mask ROM of this embodiment, a potential of the selected bit line $BL_0$ is changed from the ground level to the power supply voltage level when data is read and a potential of the non-selected bit line $BL_1$ becomes the ground level. Thus, as shown in FIG. 1, in the mask ROM of this embodiment, when data of the selected cell transistor $TG_0$ is read out, a current flows from the selected bit line $BL_0$ to the non-selected bit line $BL_1$ via the selected cell transistor $TG_0$, the source node (source line) $SL_0$ and the cell transistor $TG_1$ in this order. Note that when data of the cell transistor $TG_1$ is read out, in contrast to the description above, a current flows from the selected bit line $BL_1$ to the non-selected bit line $BL_0$ via the cell transistor $TG_1$, the source node $SL_0$ and the cell transistor $TG_0$ in this order. That is, in the mask ROM of this embodiment, where two cell transistors connected to a common source node (i.e., two transistors each of which has a gate connected to a common word line) are connected to bit lines, respectively, the direction of a current flow is different between when one of the two cell transistors is selected and when the other one of the two transistors is selected. In other words, in the mask ROM of this embodiment, when a cell transistor connected to a bit line is read out, a selected cell transistor and a non-selected cell transistor are connected to each other in series. Thus, only by changing the potential of the selected bit line from the ground level to the power supply voltage level, a current can be made to flow from the selected bit line to the non-selected bit line. Therefore, by sensing the amount of the current, a mask ROM in the contact programming scheme or the metal programming scheme, which require a small TAT (turn around time) can be realized.

In the mask ROM of this embodiment, a bit line does not have to be shared between cell transistors located adjacent in the direction in which a word line extends. Accordingly, there is no need to provide a control line for separating a selected cell transistor from non-selected cell transistors. Thus, non-selected bit lines and the first ground line 8 do not have to be driven at a voltage between the power supply voltage level and the ground potential for the purpose of separating cell transistors located adjacent to each other, so that power consumption can be reduced and the occurrence of an access delay can be suppressed. Also, in the mask ROM of this embodiment, the number of cell transistors connected to a single bit line is less than that in the known mask ROM of the left-hand side of FIG. 1. Accordingly, a floating capacitance generated in the bit line can be reduced, so that an access time can be shortened. Moreover, the mask ROM of this embodiment can be formed in about the same size as that of the known mask ROM, when the mask ROM of this embodiment and the known mask ROM are compared with the same bit number.

Furthermore, in the mask ROM of this embodiment of FIG. 2, dummy cell transistors each having a gate connected to a word line are provided so that each dummy transistor is located between a source node and the first ground line 8. The dummy cell transistors $DTG_0$, $DTG_1$, ... are provided in the same number as the number of word lines. Thus, a current flowing from the selected bit line when data is read out is connected to the first ground line 8 via a selected cell transistor, a source node and a dummy cell transistor. Accordingly, for example, even if the mask ROM is programmed so that no other cell transistor but the selected transistor is connected to a bit line, the selected bit line can be brought to the ground potential. Therefore, with the dummy cell transistors and the first ground line 8 provided, a mask ROM which does not require a restriction of program data can be realized. Note that if the first ground line 8 and the dummy cell transistor are not provided, a mask ROM is programmed using a coding technique so that at least two cell transistors of cell transistors connected to a single source node and arranged in the same row are connected to bit lines, respectively. In the example of FIG. 2, if it is assumed that the case where a cell transistor and a bit line are brought into conduction corresponds to data of "0" and the case where a cell transistor and a bit line are not brought into conduction corresponds to data of "1", "0" is recorded in two or more cell transistors corresponding to 8 bits and arranged in line in the direction in which a word line extends.

In the example of FIG. 2, the first ground line 8 is provided in every eight bit lines. However, the number of first ground lines 8 provided may be in a different ratio to the number of bit lines. Note that the more the number of cell transistors connected to a single first ground line 8 is, the more a floating capacitance when a potential is changed is increased. Also, when too many first ground lines 8 are provided, a circuit area of the mask ROM is increased. For those reasons, it is preferable that the first ground line 8 is provided in every eight bit lines. Moreover, when a single first ground line 8 is provided in every eight bit lines, the permutation of the bit lines and the first ground line 8 is not specifically limited. For example, the first ground line 8 which might be connected to the $BL_0$ through $BL_7$ via the cell transistors $Tr_0$ through $Tr_7$ may be arranged so as to be adjacent to any one of the bit lines $BL_0$ though $BL_7$. It is the most preferable that, for the purpose of preventing the generation of optical discontinuity, bit lines, first ground lines 8, cell transistors and word lines are provided so that in the whole memory array, the same positional relationship between each bit line and the first ground line 8, the same arrangement interval between cell transistors and the same interval between word lines are obtained.

Next, control performed by column control signals $CLM_0$ through $CLM_7$ will be described.

FIGS. 5, 6 and 7 are diagrams illustrating control performed by column control signals in reading out data in the mask ROM of this embodiment. As has been described, a column selection circuit (not shown) supplies the column signals $CLM_0$ though $CLM_7$ to the source line control circuit 20 in reading out data to control control transistors connected to selected bit lines so that the control transistors are brought into a non-conduction (OFF) state. In this case, one or more control transistors only need to be brought into a conduction (ON) state. For example, as shown in FIG. 5, control transistors located adjacent to a control transistor to be non-conductive are controlled so as to be in a conduction (ON) state and the rest of control transistors do not have to be controlled particularly. As another option, as shown in FIG. 6, all of other control transistors than the control transistor to be non-conductive may be controlled to be brought into a conduction state. Moreover, as shown in FIG. 7, control transistors provided in the both sides of a control transistor to be brought into a conduction state, respectively, may be brought into a conduction state as well. By the control performed in the above-described manner, a mask ROM having a smaller parasitic resistance than that of the known mask ROM can be achieved.

Next, the operation of the mask ROM of this embodiment will be further described using wave-form charts.

Figure 9:
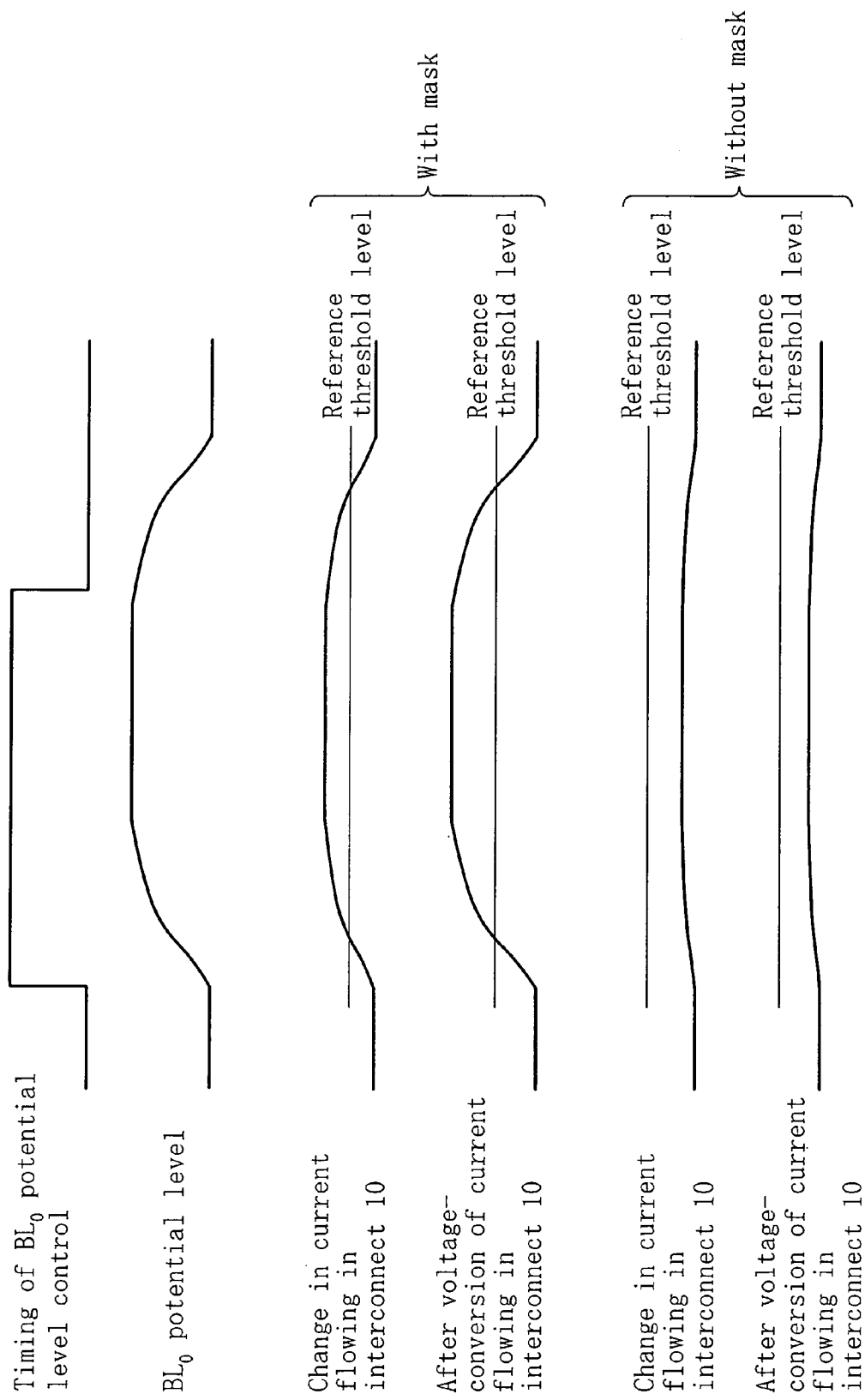
FIG. 9 is a wave-form chart showing current flowing in each interconnect and potential of each interconnect in the mask ROM of the embodiment of the present invention.

FIG. 8 is a conceptual diagram illustrating the operation of the mask ROM of this embodiment. FIG. 9 is a wave-form chart showing current flowing in each interconnect and a potential of each interconnect in the mask ROM of this embodiment. As shown in FIG. 8, in the mask ROM of this embodiment, as for two cell transistors $TG_0$ and $TG_x$ each having a gate connected to a common word line and a source connected to a common selected bit line (i.e., the bit line $BL_0$ in this case), a current flows from the selected bit line to the interconnect 10 via the cell transistor $TG_0$ and the cell transistor $TG_x$ when data is read out. In this case, if a change in the amount of a current flowing in the interconnect 10 is voltage-converted, a difference in potential between the selected bit line and the interconnect 10 can be sensed. Note that the interconnect 10 means to be a non-selected bit line or the first ground line 8 in FIG. 4.

As shown in FIG. 9, once supply of the power supply voltage to the selected bit line $BL_0$ has been started at a predetermined timing, a potential level of the $BL_0$ starts to increase from the ground level toward the power supply level. If the cell transistors $TG_0$ and $TG_x$ are connected to the selected bit line and the interconnect 10, respectively, a current flows into the interconnect 10 according to the increase in potential level of $BL_0$. A voltage obtained by converting the current flowing the interconnect 10 is sensed by a sense amplifier. Note that in reading out data, although an OFF leakage current flows slightly from a non-selected cell transistor in which a contact is not provided, the sense amplifier includes a circuit for distinguishing the OFF-leakage current from an ON current from the selected transistor and thus can perform an operation without any problem.

In contrast, where the cell transistors $TG_0$ and $TG_x$ are not connected to the selected bit line and the interconnect 10, respectively, the amount of a current flowing in the interconnect 10 is hardly changed and therefore a voltage obtained by converting the current does not exceed a threshold of the sense amplifier.

In the mask ROM of this embodiment, by the way, there is a case where a drain of a cell transistor is connected to a bit line and the case where a drain of a cell is not connected to a bit line. Therefore, the number of interconnects to serve as the interconnect 10 of FIG. 8 differs depending on regions of the memory array.

Figure 10A:
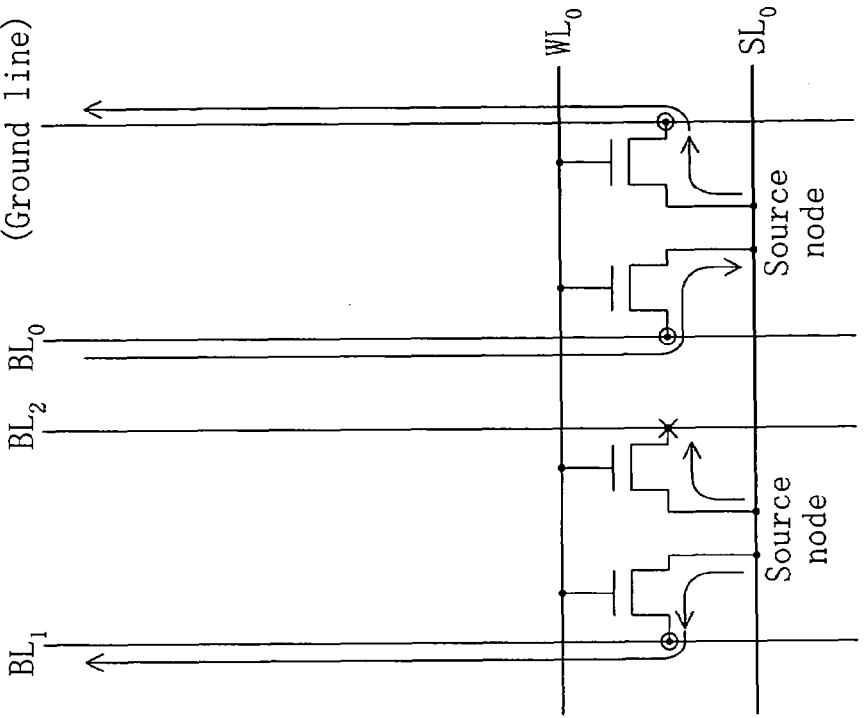
FIGS. 10A and 10B are conceptual diagrams showing examples of the operation of the mask ROM of the embodiment of the present invention.
Figure 10B:
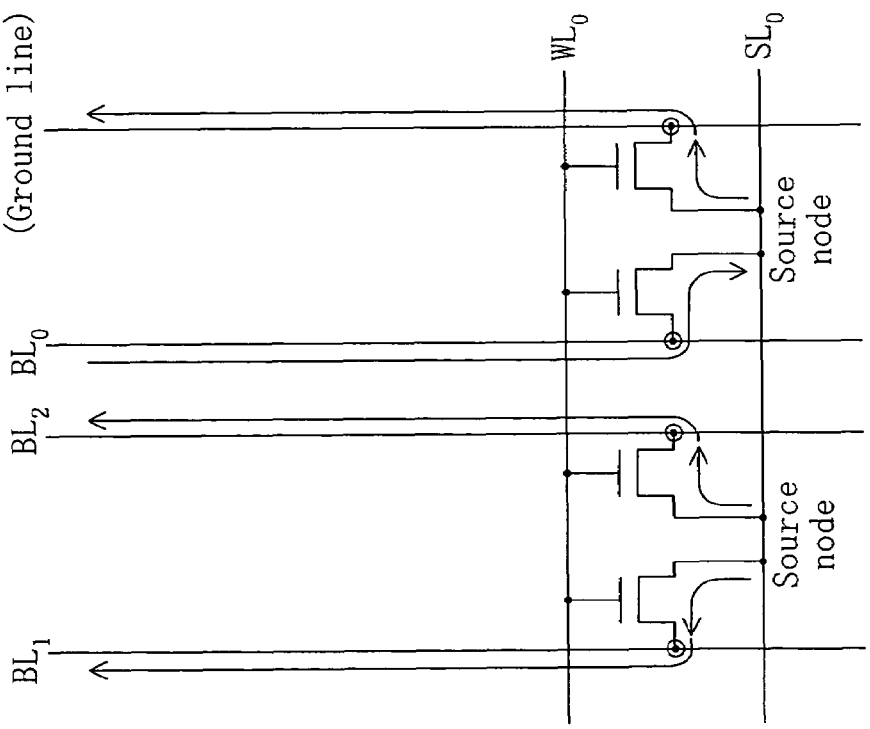
Figure 11:
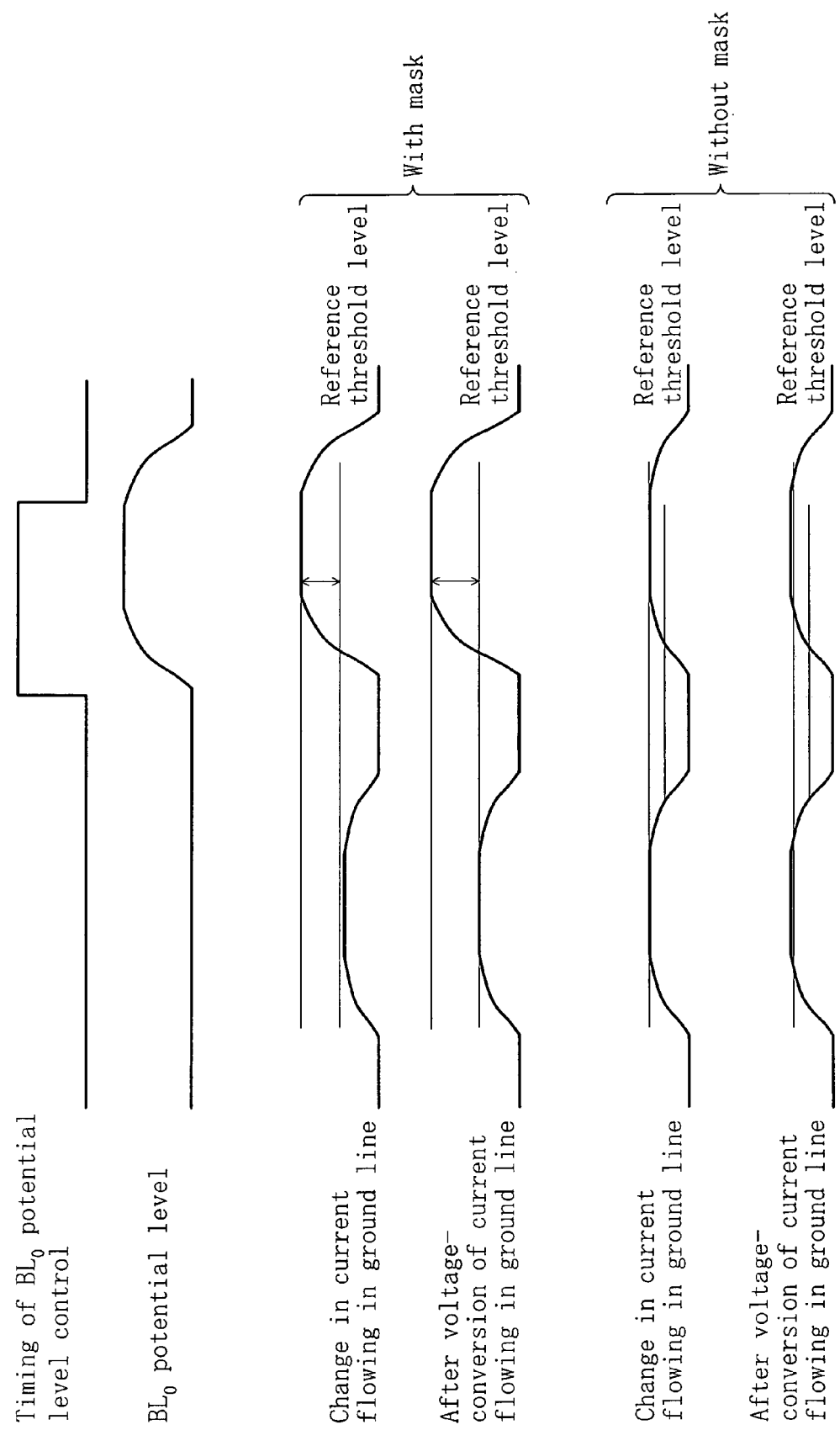
FIG. 11 is a wave-form chart illustrating current flowing in each interconnect and potential of each interconnect in the mask ROM of the embodiment of the present invention.

FIGS. 10A and 10B are conceptual diagrams illustrating examples of the operation of the mask ROM of this embodiment. FIG. 11 is a wave-form chart illustrating a current flowing in each interconnect and a potential of each interconnect in the mask ROM of this embodiment. In the example of FIG. 10A, a current flowing from the selected bit line $BL_0$ is divided into three and flows through three interconnects (i.e., the non-selected bit lines brought to the ground potential and the first ground line 8) via a source node. In contrast, in the example of FIG. 10B, a current flowing the selected bit line $BL_0$ is divided into two and flows though two interconnects via a source node. In such a case, the amount of a current flowing in a single interconnect (ground line) in the example of FIG. 10A is smaller than the amount of a current flowing in a single interconnect in the example of FIG. 10B.

As those examples show, a value of a current flowing in the interconnect 10 (i.e. ground line) might differ depending on part of the memory array. Therefore, as shown in FIG. 11, it is preferable to use, for the sense amplifier, not a scheme in which a current of a predetermined threshold or more is detected but a scheme in which a difference in the amount of a current flowing in the interconnect 10 before or after the potential of a selected bit line is changed. FIG. 11 illustrates "currents flowing in the ground line" in the case where a mask contact is present and in the case where the mask contact is not present. In FIG. 11, a convex shape portion on the left-hand side in each wave-form indicates a leakage current flowing in a bit line or the first ground line. That is, it is preferable that the sense amplifier detects a difference between a current flowing in a bit line connected to a cell transistor through a contact or a metal or the first ground line and a leakage current. Thus, even if a change in the potential of a non-selected bit line is relatively small, a difference can be detected.

Note that in the above-described mask ROM of this embodiment, the first ground line 8 and the second ground line 9 are provided. However, even when a line for supplying an arbitrary fixed voltage lower than a power supply voltage supplied to a selected bit line is provided, instead of the first ground line 8 and the second ground line 9, the mask ROM can be operated in the same manner as in the above-described embodiment.

Moreover, in the mask ROM of this embodiment, cell transistors constituting a bit cell are n-channel MOSFETs. However, all of the cell transistors may be formed of p-channel MOSFETs.

EXAMPLES

Figure 12:
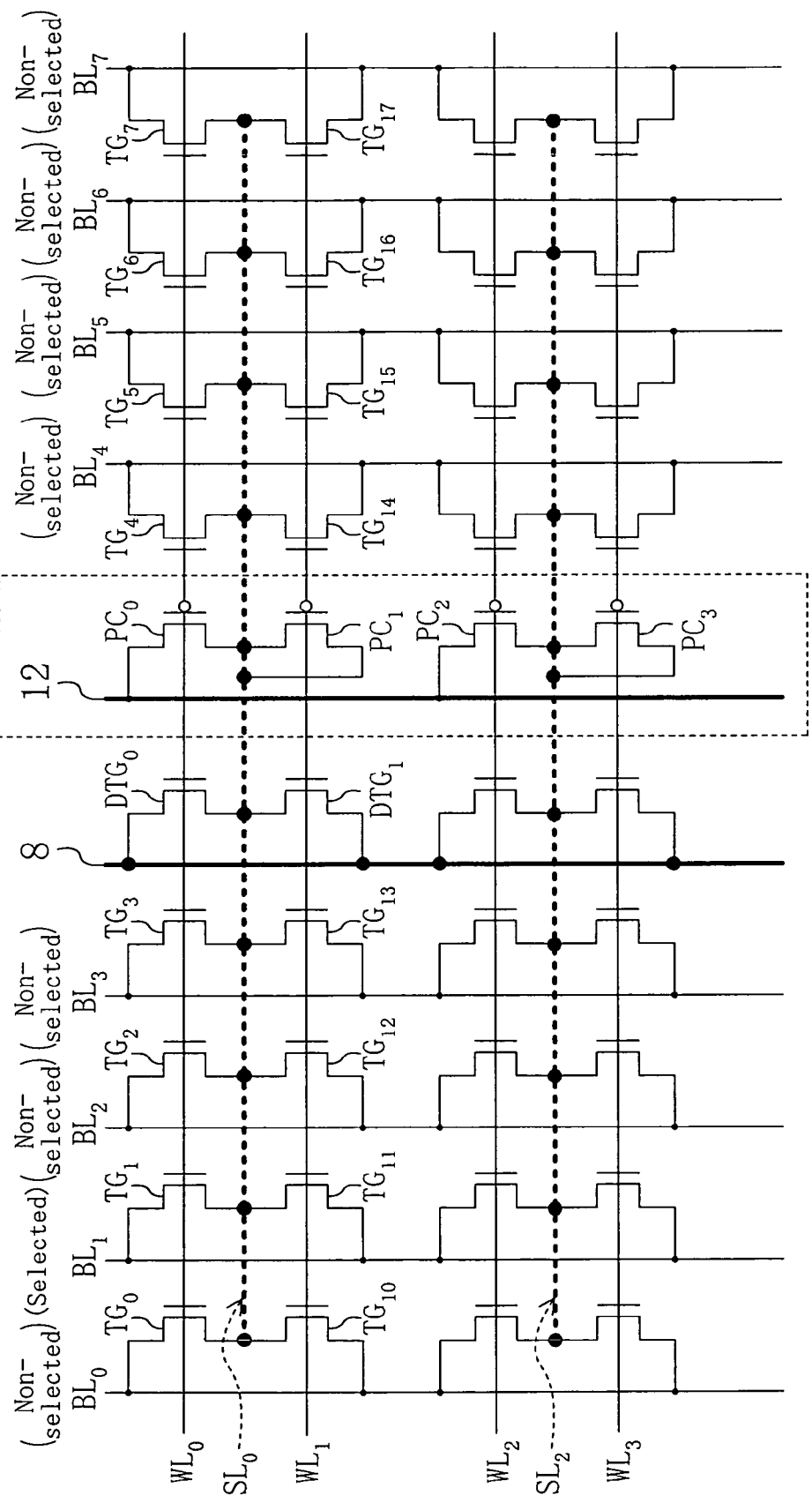
FIG. 12 is a circuit diagram of a mask ROM according to a first modified example of the embodiment of the present invention.

FIG. 12 is a circuit diagram of a mask ROM according to a first modified example of this embodiment.

In the mask ROM of the first modified embodiment has the similar configuration as that of the mask ROM of FIG. 2 except for the point that a source pre-charging circuit 11 for pre-charging a source of a non-selected cell transistor to a power supply potential in advance is provided. Hereinafter, feature part of the first modified example will be described.

The source pre-charging circuit 11 includes, for example, p-channel transistors $PC_0$, $PC_1$, $PC_2$, . . . . Gates of the p-channel transistors $PC_0$, $PC_1$, $PC_2$, . . . are connected to word lines $WL_0$, $WL_1$, $WL_2$ . . . , respectively. Drains of any two of the transistors located adjacent each other (for example, a transistor $PC_0$, i.e., a second field effect transistor, and a transistor $PC_1$, i.e., a third field effect transistor) are connected to each other. Moreover, a source of one of the adjacent two transistors (for example, the transistor $PC_1$) is connected to a source node and a source of the other one of the two adjacent transistors (for example, transistor $PC_0$) is connected to a source line 12 for supplying a power supply voltage.

With this configuration, in the source pre-charging circuit 11, of the transistors $PC_0$ through $PC_3$, transistors having a gate connected a non-selected word line are turned ON, so that a power supply voltage is supplied to a source node connected to the transistors in an ON state. Accordingly, a source of each cell transistors having a gate connected to a non-selected word line is pre-charged to the power supply potential. Thus, a bit line leakage current ($I_{off}$) flowing via the non-selected cell transistor can be suppressed. The reason why the bit line leakage current $I_{off}$ is suppressed and the necessity to suppress the bit line leakage current $I_{off}$ will be briefly described.

Figure 13:
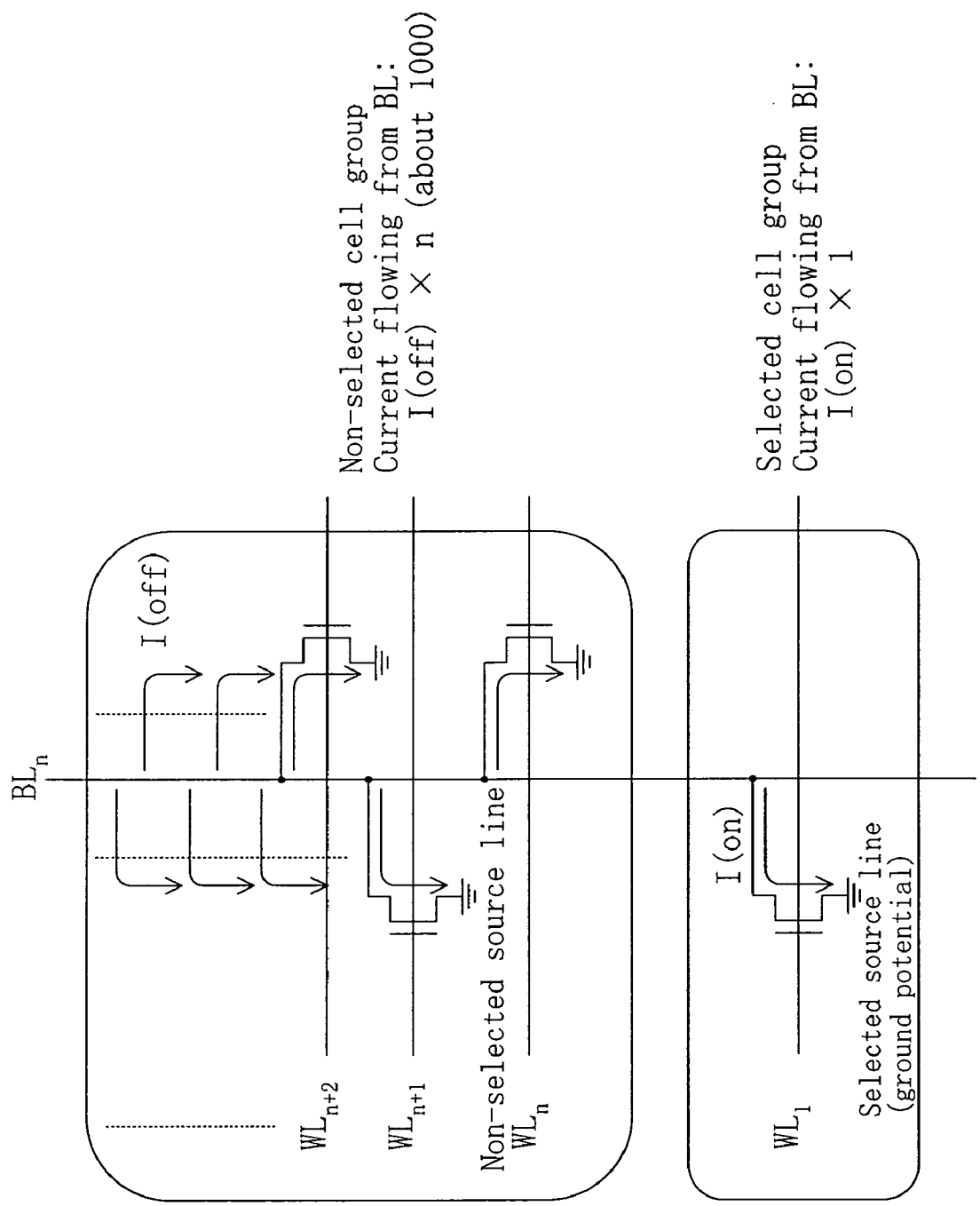
FIG. 13 is a diagram schematically illustrating a bit line leakage current in the mask ROM of the first modified example of the embodiment of the present invention.

FIG. 13 is a diagram schematically illustrating a bit line leakage current in the mask ROM of this modified example. A bit line leakage current shown in FIG. 13 is a current flowing in a ground line (for example, the first ground line 8 and the second ground line 9 in FIG. 4) via each cell transistor. Therefore, as long as the ground line is not the ground potential (0 V) but a potential close to the power supply potential ($\alpha$ V), a potential difference between the gate potential (0 V) and the source potential in each non-selected cell transistor becomes negative ($-\alpha$ V), so that a leakage current can be suppressed.

In reading the mask ROM, usually only one cell transistor is selected. Also, there might be cases where about 1000 non-selected cell transistors are connected to a single bit line. Accordingly, if an OFF leakage current from cell transistors is not sufficiently suppressed, the OFF leakage current easily exceeds an ON current from a selected cell transistor. Therefore, it is very important to reduce OFF leakage currents from non-selected cell transistors.

On the other hand, in the source pre-charging circuit 11, when one of word lines connected to gates of arbitrary two adjacent transistors is selected, one of the two transistors becomes in an OFF state and the power supply line 12 is not connected to a source node connected to a selected transistor, so that reading data can not be prevented. Therefore, in the mask ROM of this modified example, not only an access time but also power consumption can be reduced furthermore, compared to the mask ROM of FIG. 2, and also reading accuracy can be improved, compared to the known mask ROM.

The source pre-charging circuit 11 may have a configuration for supplying a power supply voltage or a high voltage close to the power supply voltage to a source of a non-selected cell transistor, other than the configuration of FIG. 12.

Figure 14:
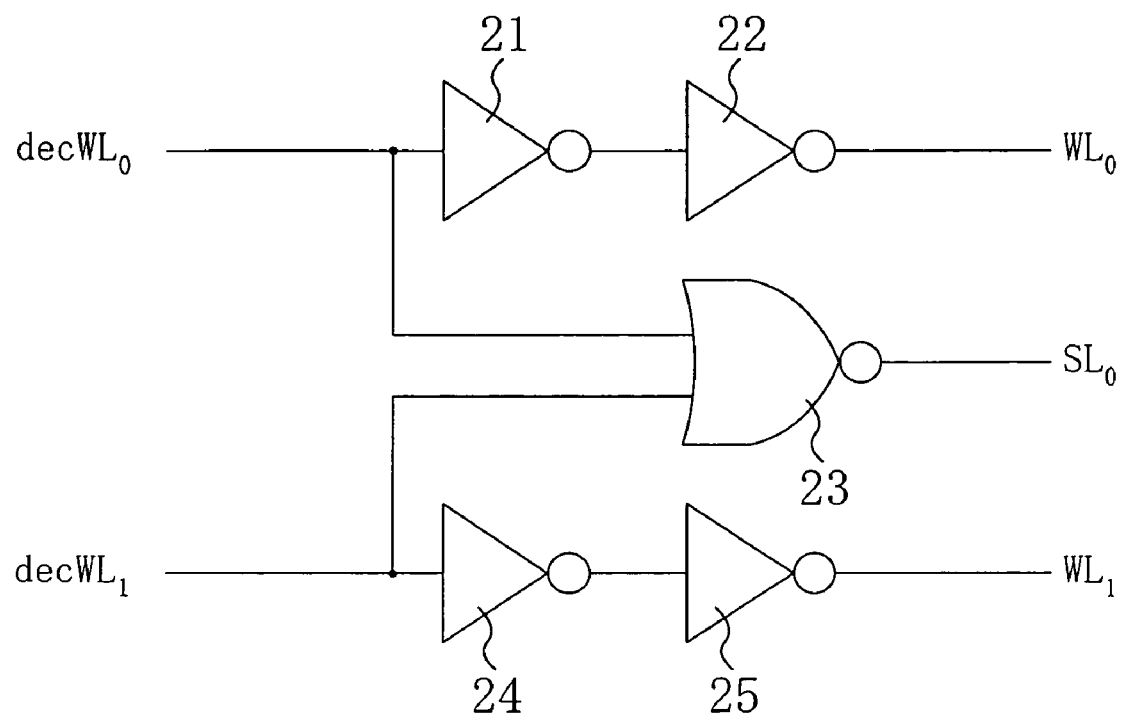
FIG. 14 is a circuit diagram of a control circuit for word lines and a source node used in a mask ROM according to the present invention.

Next, FIG. 14 is a circuit diagram of a control circuit for word lines and a source node used in a mask ROM according to the present invention. The control circuit for a word line and a source node shown in FIG. 14 can be commonly used in the mask ROMs of FIGS. 2, 4 and 12. The word line/source node control circuit controls two word lines located adjacent to each other and a source node between the two word lines. For example, the word line/source note control circuit includes a first inverter 21 having an input section to which a first control interconnect decWL$_0$ is connected, a second inverter 22 having an input section connected to an output section of the first inverter 21 and an output section connected to a word line WL$_0$, a NOR gate 23 having a first input section and a second input section to which the control interconnect decWL$_0$ and a second control interconnect decWL$_1$ are connected, respectively, and an output section to which a source node SL$_0$ is connected, a third inverter 24 having an input section to which the second control interconnect decWL$_1$ is connected, and a fourth inverter 25 having an input section connected to an output section of the third inverter 24 and an output section connected to a word line WL$_1$. Although not shown in FIG. 14, the first control interconnect decWL$_0$ and the second control interconnect decWL$_1$ are connected to a row decoder.

With the word line/source node control circuit, the same signal as that to be sent to the first control interconnect decWL$_0$ is sent to the word line WL$_0$ and a signal at the same level as that of the second control interconnect decWL$_1$ is sent to the word line WL$_1$. Only when the first control interconnect decWL$_0$ and the second control interconnect decWL$_1$ are L (low), the source node SL$_0$ becomes H (high) (i.e., power supply potential). In other cases, control is performed so that the source node SL$_0$ becomes "L", i.e., the ground potential. Thus, the source node when a selected transistor is connected is made to be a low potential and the source node when a selected transistor is not connected is maintained at a high potential, so that a leakage current form non-selected cell transistor can be suppressed.

Figure 15:
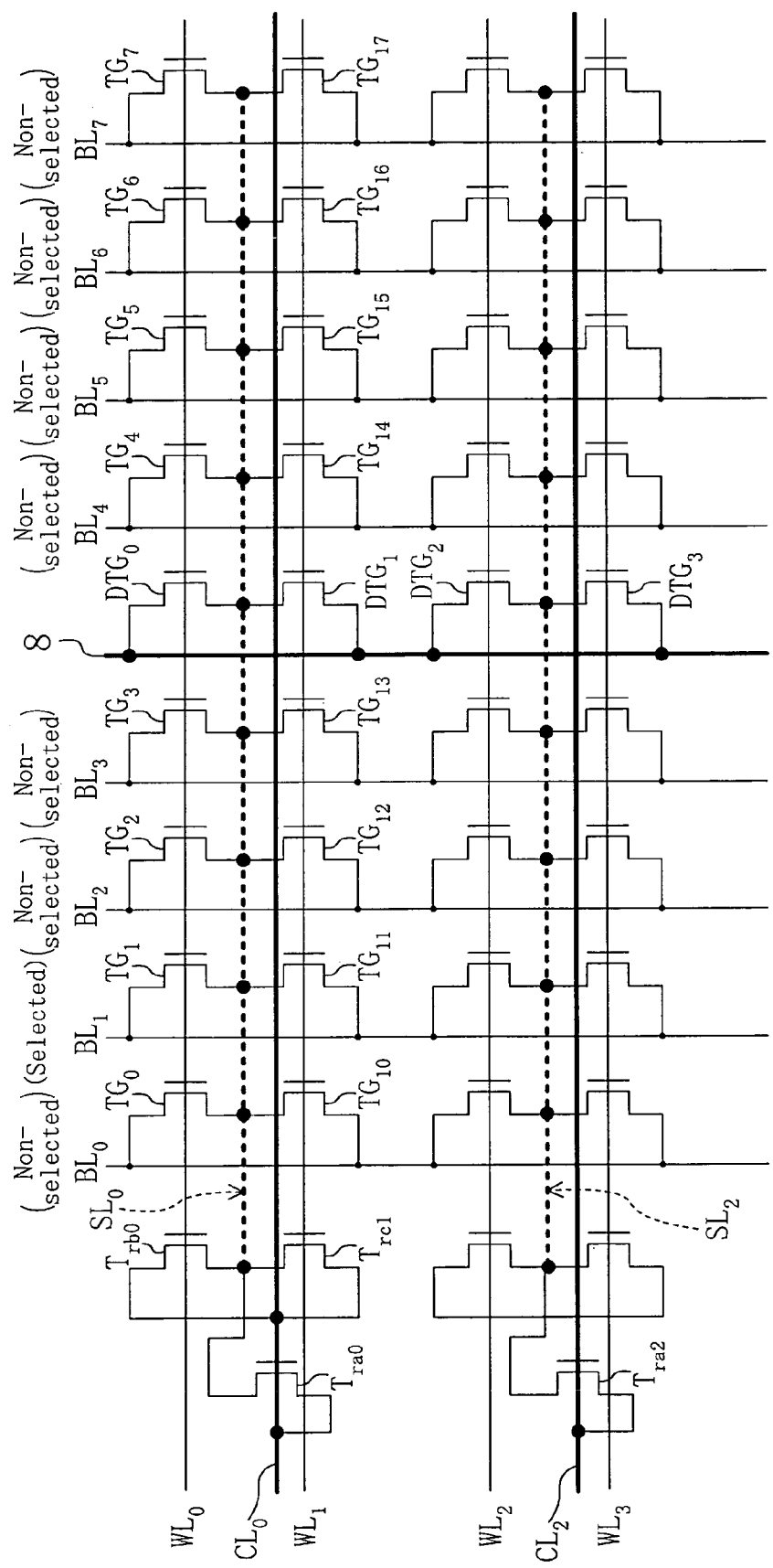
FIG. 15 is a circuit diagram of a mask ROM according to a second modified example of the embodiment of the present invention.

FIG. 15 is a circuit diagram of a mask ROM according to a second modified example of this embodiment. As shown in FIG. 15, a mask ROM according to the second modified example includes a control line extending in the direction in which adjacent two word lines WL$_n$ and WL$_{n+1}$ extend and disposed between the word lines WL$_n$ and WL$_{n+1}$, n-channel first transistors (fourth field effect transistors) Tra$_n$, Tra$_{n+2}$, . . . each having a drain and a gate connected to a control lines CL$_0$, CL$_2$, . . . or CL$_n$ and a source connected to a source node SL$_n$, an n-channel second transistor (fifth field effect transistor) Trb$_n$ having a drain connected to a control line CL$_n$, a source connected to the source node SL$_n$ and a gate connected to the word line WL$_n$, and an n-channel third transistor (sixth field effect transistor) Trc$_{n+1}$ having a drain connected to the control line CL$_{n+1}$, a source connected to a source node SL$_{n+1}$ and the source of the second transistor, and a gate connected to the word line WL$_{n+1}$. Moreover, the source of the second transistor Trb$_n$ and the source of the third transistor Trc$_{n+1}$ are connected to the source of the first transistor Tra$_n$. In this case, n is an even number including 0.

With this configuration, the source node SL$_n$ connected to a selected cell transistor of a selected bit cell is connected to the control line CL$_n$. The control line CL$_n$ is a line through which a signal generated in the control circuit of FIG. 14 is supplied. Thus, when one of adjacent two word lines is selected, a source node is driven in the ground potential direction, and when both of the adjacent two word lines are not selected, a source node is driven in the power supply potential direction. As a result, source nodes can be selectively driven at the ground potential. Therefore, a leakage current can be reduced.

A contact programming mask ROM or a metal programming mask ROM according to the present invention includes source nodes electrically separated and is useful as a memory and the like which performs source line control. Moreover, the configuration of the mask ROM of the present invention can be applied to a memory and the like other than a mask ROM which performs source line control.

What is claimed is:

1. A mask ROM comprising:

a plurality of bit lines;

a plurality of word lines disposed so as to intersect with the plurality of bit lines;

a plurality of bit cells provided along with the plurality of bit lines or the plurality of word lines, each of the bit cells being formed of a first conductivity type cell transistor having a gate electrode connected to one of the plurality of word lines wherein data is recorded by connection/disconnection between a drain of the cell transistor and one of the plurality of bit lines wherein if among the plurality of word lines, word lines located adjacent to each other are a first word line and a second word line, respectively, the mask ROM further includes a source node commonly connected to respective sources of cell transistors each having a gate electrode connected to the first word line or the second word line, and wherein if among the cell transistors in the bit cells, a transistor connected to a bit line is selected from the plurality of bit lines and the source node is selected in reading out data, a current flows from the selected bit line to the source node via the selected cell transistor;

the mask ROM further comprising a first power supply line, wherein in reading out data, the selected bit line is connected to a bit line connected to a non-selected cell transistor via the selected cell transistor and the source node, or the first power supply line; and the mask ROM still further comprising a first conductivity type dummy cell transistor provided between the source node and the first power supply line and having a gate connected to the first word line or the second word line connected to the gate of the selected cell transistor and a drain connected to the source nodes wherein the first conductivity type dummy cell transistor conducts a voltage level of the first power supply line to the source node when a cell transistor connected to a word line which the first conductivity type dummy cell is connected to is selected.

2. A mask ROM comprising:

a plurality of bit lines;

a plurality of word lines disposed so as to intersect with the plurality of bit lines;

a plurality of bit cells provided along the plurality of bit lines or the plurality of word lines, each of the bit cells being formed of a first conductivity type cell transistor having a gate electrode connected to one of the plurality of word lines, wherein data is recorded by connection/disconnection between a drain of the cell transistor and one of the plurality of bit lines wherein if among the plurality of word lines, word lines located adjacent to each other are a first word line and a second word line, respectively, the mask ROM further includes a source node commonly connected to respective sources of cell transistors each having a gate electrode connected to the first word line or the second word line, and wherein if among the cell transistors in the bit cells, a transistor is connected to a bit line selected from the plurality of bit lines and the source node is selected in reading out data, a current flows from the selected bit line to the source node via the selected cell transistor;

the mask ROM further comprising a first power supply line, wherein in reading out data, the selected bit line is connected to a bit line connected to a non-selected cell transistor via the selected cell transistor and the source node or the first power supply line and wherein in reading out data, the selected bit line is connected to the first power supply line of which a potential is lower than a potential of the selected bit line; and the mask ROM further comprising a source pre-charging circuit for pre-charging, if the selected cell transistor is not connected to the source node in reading out data, a source of the cell transistor connected to the source node, wherein the source pre-charging circuit includes a third power supply line for supplying a higher voltage than voltages of the first power supply line and the second power supply line, a second conductivity type second field effect transistor having a source connected to the third power supply line and a gate connected to the first word line, and a second conductivity type third field effect transistor having a source connected to the drain of the second field effect transistor, a drain connected to the source node and a gate connected to the second word line.

3. A mask ROM comprising:
a plurality of bit lines;
a plurality of word lines disposed so as to intersect with the plurality of bit lines;
a plurality of bit cells provided along the plurality of bit lines or the plurality of word lines, each of the bit cells being formed of a first conductivity type cell transistor having a gate electrode connected to one of the plurality of word lines,
wherein data is recorded by connection/disconnection between a drain of the cell transistor and one of the plurality of bit lines
wherein if among the plurality of word lines, word lines located adjacent to each other are a first word line and a second word line, respectively, the mask ROM further includes a source node commonly connected to respective sources of cell transistors each having a gate electrode connected to the first word line or the second word line, and
wherein if among the cell transistors in the bit cells, a transistor is connected to a bit line selected from the plurality of bit lines and the source node is selected in reading out data, a current flows from the selected bit line to the source node via the selected cell transistor;
the mask ROM further comprising a control line of which a potential becomes an equal level to a potential level of the selected first or second word line when one of the first word line and the second word line is selected and becomes a different level from a potential level of the first word line or the second word line when neither the first word line nor the second word line is selected,
wherein in reading out data, the control line is connected to the source node;
the mask ROM still further comprising:
a first conductivity type fourth field effect transistor having a drain and a gate each being connected to the control line and a source connected to the source node;
a first conductivity type fifth field effect transistor provided between the control line and the source node and having a gate connected to the first word line; and
a first conductivity type sixth field effect transistor provided between the control line and the source node and having a gate connected to the second word line.

* * * * *